(12) United States Patent
Murshid

(10) Patent No.: US 8,278,728 B2
(45) Date of Patent: Oct. 2, 2012

(54) ARRAY OF CONCENTRIC CMOS PHOTODIODES FOR DETECTION AND DE-MULTIPLEXING OF SPATIALLY MODULATED OPTICAL CHANNELS

(75) Inventor: Syed Murshid, Palm Bay, FL (US)

(73) Assignee: Florida Institute of Technology, Melbourne, FL (US)

( * ) Notice: Subject to any disclaimer, the term of this patent is extended or adjusted under 35 U.S.C. 154(b) by 392 days.

(21) Appl. No.: 12/581,121

(22) Filed: Oct. 17, 2009

(65) Prior Publication Data

US 2011/0089518 A1    Apr. 21, 2011

(51) Int. Cl.
*H01L 31/00* (2006.01)

(52) U.S. Cl. ............... 257/448; 257/653; 257/E29.024; 257/E31.032

(58) Field of Classification Search ............ 257/291, 257/448, 653, E29.024, E31.032, 292
See application file for complete search history.

(56) References Cited

U.S. PATENT DOCUMENTS

| | | | |
|---|---|---|---|
| 2002/0185665 A1* | 12/2002 | Kuhara et al. | 257/228 |
| 2007/0268113 A1* | 11/2007 | Johnson | 340/10.1 |
| 2009/0261418 A1* | 10/2009 | Yajima | 257/356 |

* cited by examiner

*Primary Examiner* — Tuan N. Quach
(74) *Attorney, Agent, or Firm* — Joel I. Rosenblatt

(57) ABSTRACT

An octagonal structure of photodiodes using standard CMOS technology has been developed to serve as a de-multiplexer for spatially multiplexed fiber optic communication systems.

16 Claims, 15 Drawing Sheets

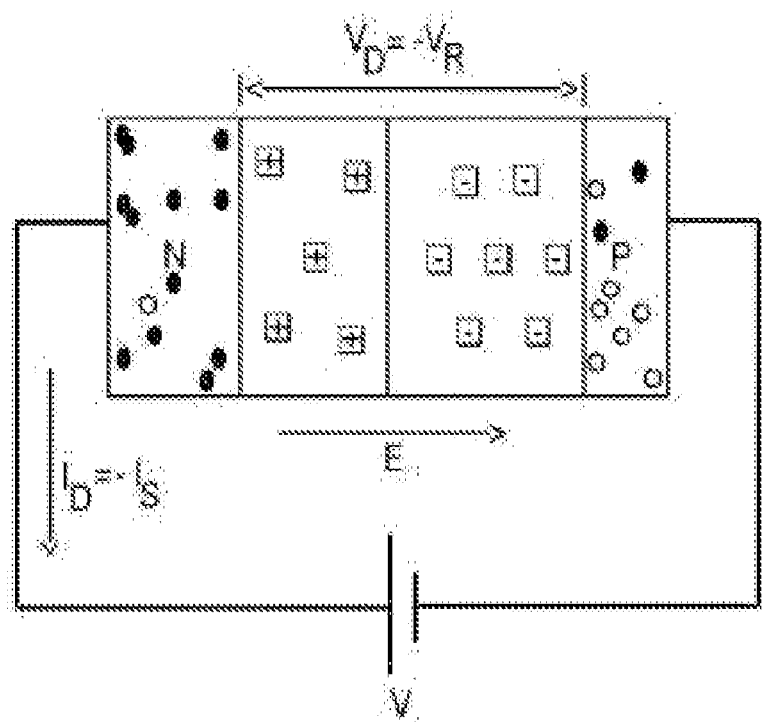
Figure 1    PRIOR ART
Figure 2:    PRIOR ART

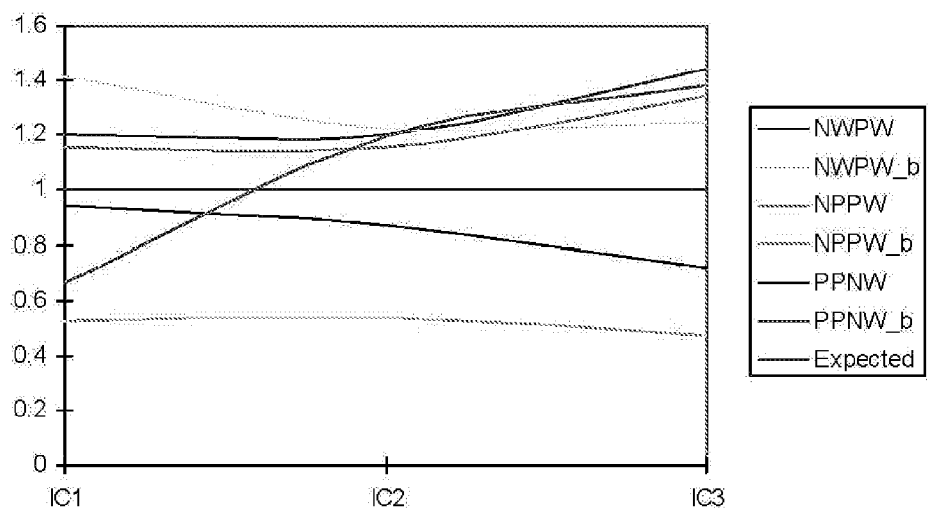
Figure 10c: Quantumm Efficiency of Ring 2 Octogons at 660 nm

ARRAY OF CONCENTRIC CMOS PHOTODIODES FOR DETECTION AND DE-MULTIPLEXING OF SPATIALLY MODULATED OPTICAL CHANNELS

BACKGROUND

The demand for communication bandwidth is ever increasing. Fiber optic communication provides an excellent solution to this requirement and techniques like spatial domain multiplexing (SDM) can increase fiber capacity by many folds. SDM adds a new dimension in optical fiber multiplexing techniques by allowing spatially separated, co-propagating channels of the same wavelength over a single strand of optical fiber thereby increasing the fiber capacity. These channels follow helical path, and each channel is confined to a dedicated radial distance from the center of the fiber. The centermost channel generally exits the output end of the fiber in the form of a spot while the outer channels appear as concentric rings.

As compared to a standard fiber communication system, the SDM system requires two additional components; the multiplexer or the beam combination module (BCM) and the demultiplexer or the beam separation module (BSM). Current setup of SDM systems employ a lens/photodiode combination for de-multiplexing of spatially multiplexed channels. This requires tedious alignment and is prone to environmental perturbations.

SUMMARY

A method and apparatus for spatial domain multiplexing in optical fiber communications is disclosed in U.S. Pat. No. 7,174,067 and incorporated in this application by reference.

Success of SDM based systems requires enabling solutions for mass production, for example, as may be provided by standard CMOS (complementary metal oxide semiconductor) technology. CMOS electrical and optical properties are very compatible with the requirements of photonics industry and it can provide a fast and inexpensive route for mass production. Hence a unique and novel array of concentric photodiodes using CMOS technology is shown and shown according to the disclosed inventive principles, to detect and reliably de-multiplex optical energies carried by the spatially multiplexed channels. This innovative array of photo-detectors may also be applied to other applications such as sensors. Multiple devices have been designed and fabricated using standard 0.25 um CMOS technology and packaged in an open cavity packaging (OCP) to allow exposure to the incident light. Initial results are satisfactory.

BRIEF DESCRIPTION OF THE DRAWINGS

FIG. 1 shows a Reverse Bias PN-Junction.
FIG. 2 shows PN-Junctions in a Standard CMOS.
FIG. 10*c*: Quantum Efficiency of Ring 2 Octagons at 660 nm.

DETAILED DESCRIPTION

Figure 3:
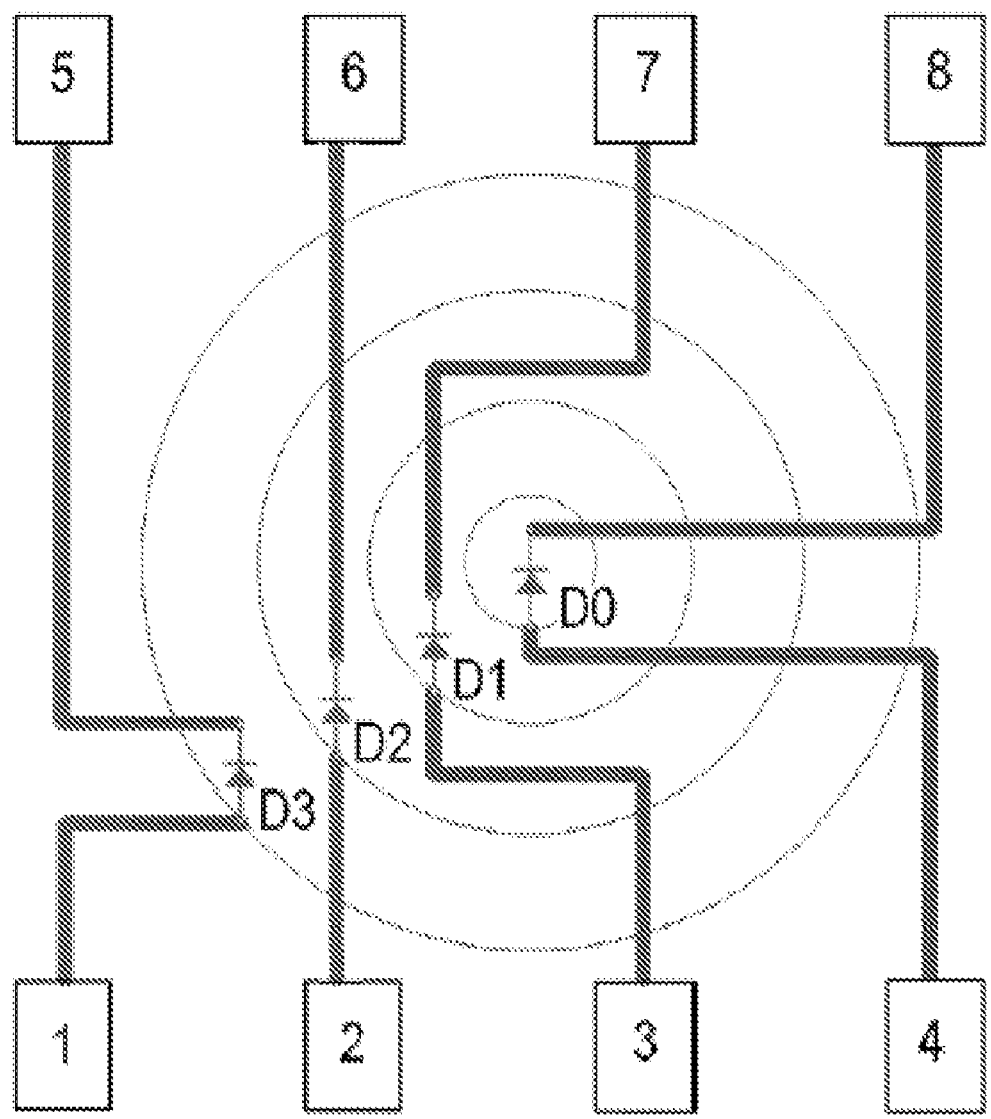
FIG. 3 shows the Concentric Photodiodes in a Schematic Diagram.

As would be well known to those skilled in the art, a photodiode is a transducer that converts incident optical energy into electrical energy. The electrical and optical properties of a P-N junction and the depletion region are of prime importance in the operation of a photodiode. A simple P-N junction is formed when a P-type material comes in contact with an N-type material during monolithic fabrication process and a depletion region is created at the P-N junction due to recombination of electrons and holes, which annihilate each other during their random motion around the junction. This leaves excess fixed charges: positive donor ions at the N-type region and negative acceptor ions at the P-type area. These charges create a field at the P-N junction that consequently blocks further transport of the charge carriers. Therefore photodiodes are typically used in the reverse-bias configuration, as shown in FIG. 1.

Similar to rectifying diodes, only the leakage current flows in the reverse bias region of the photodiode, in the absence of any illuminating optical energy. However electron-hole pairs are generated as a function of the intensity of light absorbed by the material, provided a photo detector is exposed to a light source with frequencies that correspond to energies greater than the band gap of the detector material. Hence the reverse current of the photodiode increases in proportion to the incident light intensity, in the presence of an applied electric field. The standard CMOS technology, as would be well known to those skilled in the art, offers three different types of P-N junctions:

P+ Diffusion to N-well
N+ Diffusion to P-substrate
N-well to P-substrate,

Implementation of photodiodes using these P-N junctions in the standard CMOS technology, are known to those skilled in the art. Disclosed is a system and method for concentric photodiodes, according to the disclosed inventive principles. The concentric photodiodes is shown for a preferred embodiment, in CMOS technology and may be fabricated in other suitable technology.

According to the disclosed inventive principles, concentric photo detectors based on all three types of P-N junctions could be made in the standard CMOS process. According to the disclosed inventive principles, shown and disclosed are two different variations of concentric photodiodes for each of the P-N junctions. Each variant structure employs the disclosed isolation techniques to minimize the cross influence of adjacent concentric devices, one on the other. Technologies with multiple wells offer more robust inter-diode isolation options that could be employed for additional refinement. The photocurrent has three main components $$I_d = qAJg_n wd$$

$$I_n = qAIg_n L_n$$

$$I_p = qAJg_n L_p$$

Where Id is photocurrent due to carrier generation in depletion layer, $I_n$ is photocurrent due to diffusion of excess electrons in P-type region and Ip is the photocurrent due to diffusion of excess holes in N-type region, q is electron charge ($1.6 \times 10^{-19}$ C), AJ is the area of the P-N junction, gn is the number of electron-hole pairs generated in a unit of the depletion-layer volume per second, $L_n$ is depletion length of electrons and Lp is depletion length of the holes. Adding the three components together, the total photocurrent becomes:

$$I\text{photo} = qAJg_n(wd + L_n + Lp)$$

Where, wd is the depletion region width.

Analysis of the photo current equation reveals that amount of photocurrent generated by a photodiode is directly proportional to the four parameters, the area of the P-N junction, the width of the depletion region, depletion length of the electrons and the depletion length of the holes. The schematic diagram of a concentric photodiodes in an array of P and N semiconductor material, is given in the FIG. 3. The array, as shown and described in FIG. 3, is a plurality of concentric semiconductor materials, with each concentric semiconductor material joined to, and in contact with, or with an interface with, the next respective inner and outer, concentric semiconductor in the array and arranged in a junction with the next respective inner and outer concentric semiconductor. As would be known to those skilled in the art, a P-N junctions is at the interface or contact between the P and N semiconductors, shown schematically by the photodiodes, as shown in FIG. 1, between the contacts or terminals D0, D1, D2, D3, in FIG. 3.

As would be known to those skilled in the art, the contacts or terminals for each photodiode D0, DI, D2, D3, may be connected to an electrical source for biasing the P-N junctions and to a means for measuring the current in the P-N junction, $I_s$.

Figure 4:
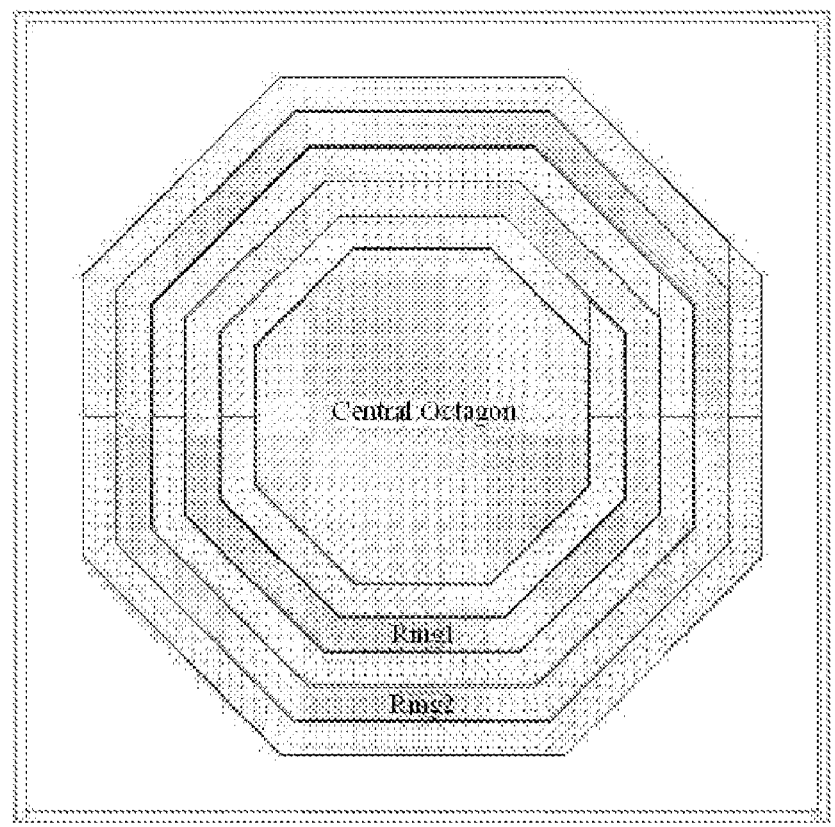
FIG. 4 shows an N-well/P-substrate Concentric Photodiode.
Figure 6:
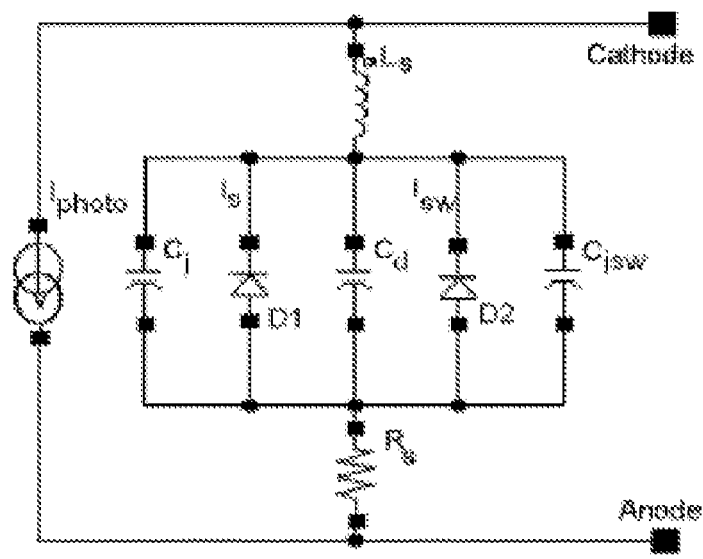
FIG. 6 shows a Single Concentric Photodiode Equivalent Circuit.

As would be known to those skilled in the art, light on the photodiodes, for example as shown in FIG. 1 or in FIG. 3, produce a current $I_D$, as shown in FIG. 1 or $I_{photo}$, as shown in FIG. 6. This unique geometry of concentric photodiode structure provides an interface or contact area for the junction of the alternate P and N semiconductor material and a corresponding depletion region compared to other structural implementations. For example, the ring structure shown for the concentric semiconductor array, for example in FIG. 4, shown for a polygon, has a continuous PN junction throughout the perimeter of the polygon. Where the polygon is made annular, or circular, as shown in FIG. 3, the P N contact area and the P N junction depletion region may be coextensive with the annular circumference. This results in increased photocurrent per unit area for this type of concentric photodiodes, over conventional or prior art photodiodes.

As shown in FIG. 3, the array of semiconductor photodiodes may be annular or circular. Modulated light in an annular of circular projection or beam, for example as shown in disclosed in U.S. Pat. No. 7,174,006, may be made incident on respective P-N junction photodiodes to produce separate respective signals for separate respective modulated light projections.

As would be understood by those skilled in the art, the concentric semiconductor photodiode array, is or has, the electrical property of an inductance. This unique characteristic of the concentric structure or array, is an inductance and is inductive and produces an inductive effect, shown in FIG. 6 by inductance $L_s$. The inductance is from the separate concentric semiconductors joined in a respective P-N junction. This unique inductive effect which increases with high frequency modulation of an optical carrier, may be used, for example in connection with the depletion area capacitance $C_{dep}$ in an inductive capacitive (LC) circuit for fine tuning of the photodiodes for high frequency applications.

A preferred embodiment, according to the disclosed inventive principles, for a N-well/P-substrate P-N junction based photodiode structure is shown in FIG. 4. This polygon shown as a preferred embodiment is not limiting of the inventive principles, disclosed in an annular or circular concentric photodiode array, for example in FIG. 3.

Figure 5:
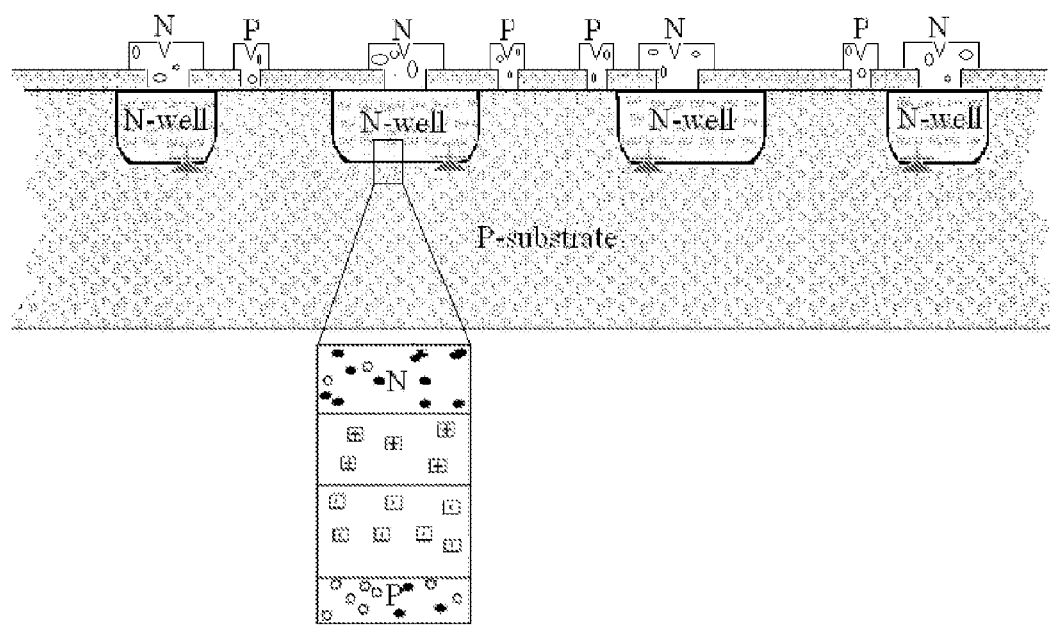
FIG. 5 shows an N-well/P-substrate Photodiode Cross-Section.

The junction or depletion layer capacitance is given by:

$$Cdep = \frac{\epsilon o \epsilon r A}{W}$$

Where A is the cross sectional area, $\epsilon o$ and $\epsilon r$ are the absolute and relative permittivity of the material, and W is the width of the depletion layer. To allow photo-detection at high modulation frequencies, the junction or depletion layer capacitance needs to be made small enough to allow that high frequency detection. This may be achieved by reducing the cross sectional area or by increasing the width W FIG. 5 shows cross-sectional view of the three channels N-well/P-substrate based concentric photodiode structure whose top view is shown in FIG. 4. The concentricity of the structures is highlighted in top view, the photodiode active areas are concentric circles, the space and area dimensions of the active regions are guided by two factors first is the process technology design rules and second is the intended application.

Any of the PN-junctions, for example as offered by the CMOS technology could be used to implement these structures. CMOS structure used in the disclosed invention include two separate layout schemes of 3-channel N-well/P-substrate photodiodes, a 3-channel N+/P-substrate photodiode and a 4-channel N+/P-substrate photodiode with a different isolation scheme, and two separate implementations of 3-channel and 4-channel P+/N-well concentric photodiodes. The equivalent circuit of a single concentric photodiode is shown in the FIG. 6.

The following is the list of process parameters extracted from the foundry data:

js: junction saturation current (A)
jsw: junction sidewall saturation current (A)
Cd: Linear capacitance (F)
cjo: Zero-bias junction capacitance (F)
cjsw: Zero-bias sidewall junction capacitance (F)
by: Reverse breakdown voltage (V)
ibv: Current at breakdown voltage (A)
rs: Series Resistance (0)
eg: Band gap (eV)
eta: junction capacitance temperature coefficient
ctp: Sidewall junction capacitance temperature coefficient
pta: junction potential temperature coefficient
ptp: Sidewall junction potential temperature coefficient Referring to FIG. 6, Iphoto represents the current generated by the incident light, cjI is the bottom junction capacitance, Is is the saturation current, cd is the linear capacitance, isw is the side wall saturation current, cjsw is the sidewall junction capacitance, Rs is the series resistance and Ls is the built in inductance effect.

Figure 7:
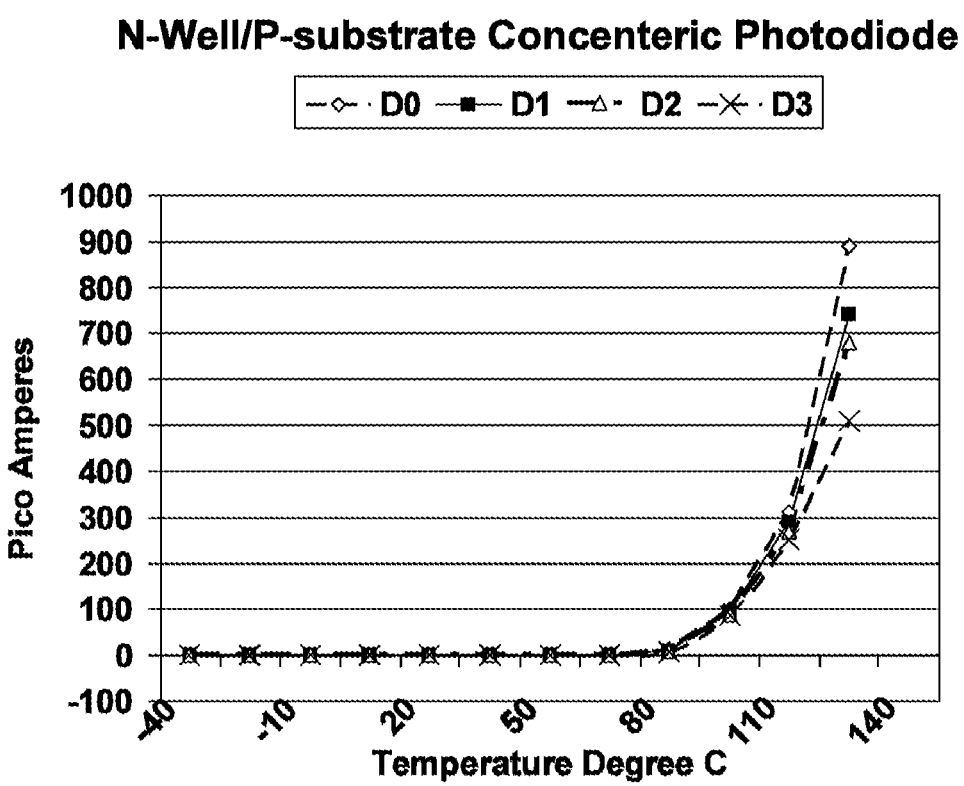
FIG. 7 shows Dark Current vs. Temperature.

According to the disclosed inventive principles, the results of dark current for four concentric photodiodes of a NPPW concentric photodiode structure versus temperature are shown are FIG. 7. The dark current is a small amount of current that flows when a reverse bias is applied to a photodiode without any incident light.

The FIG. 7 shows that ambient temperature variations affect photodiode dark current. The increase in temperature increases the excitation of the valence band electrons, pulling them in the conduction band and results in increase in dark current. However the generation-recombination current and the diffusion current are dominant and determine the temperature dependence of the dark current.

According to the disclosed inventive principles, and as shown for a preferred embodiment, in FIG. 4, the concentric semiconductor may be fabricated with a have a plurality of photodiode structures and a plurality of P-N junctions. A preferred embodiment may be fabricated using the standard 0.25 um CMOS process and packaged in OCP_QFN_7×7_44A. In a commercially available package, forty pins provide access to the anodes and cathodes of each of the twenty concentric photodiodes on the chip.

For a preferred embodiment, as shown in the best mode, the electro-optical parameters are derived using IF-E96 low-cost, high-speed, visible red LED based optical transmitter modulated at 1.25 KHz. The output spectrum of IF-E96 peaks at 660 nm. The optical power output of our optical transmitter, as measured by a photometer is approximately 0.11 mW.

The measure of effectiveness of a photodiode in converting optical energy into electrical energy is called the responsivity of the photodiode. It is defined as the ratio of photocurrent Ip to the incident light power P at a particular wavelength:

$$R = I_p/P (A/W)$$

Figure 8A:
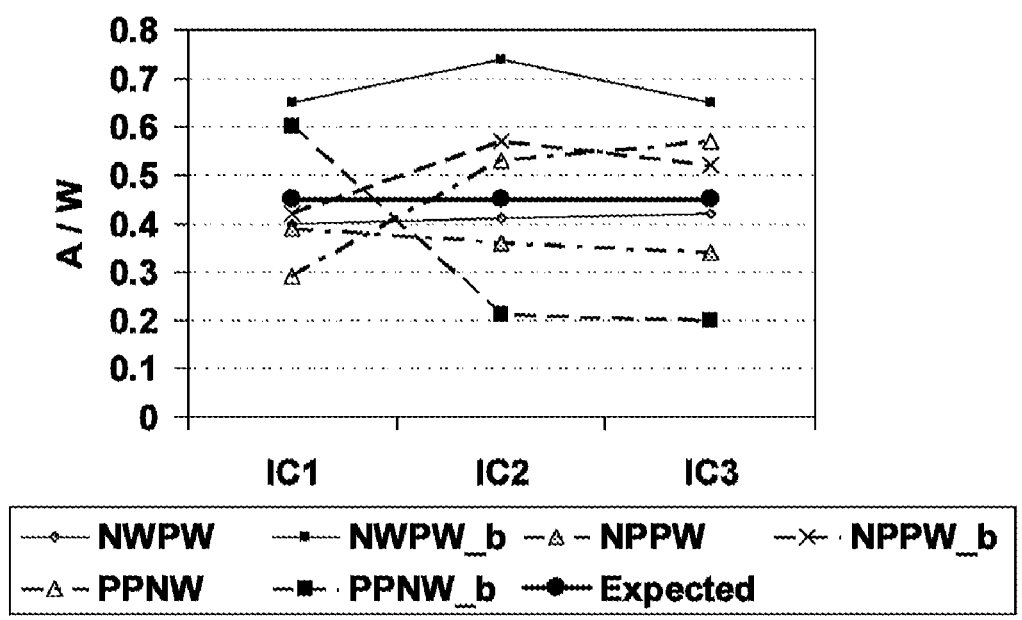
FIG. 8*a* shows Responsivities of the Central Octagons.
Figure 8B:
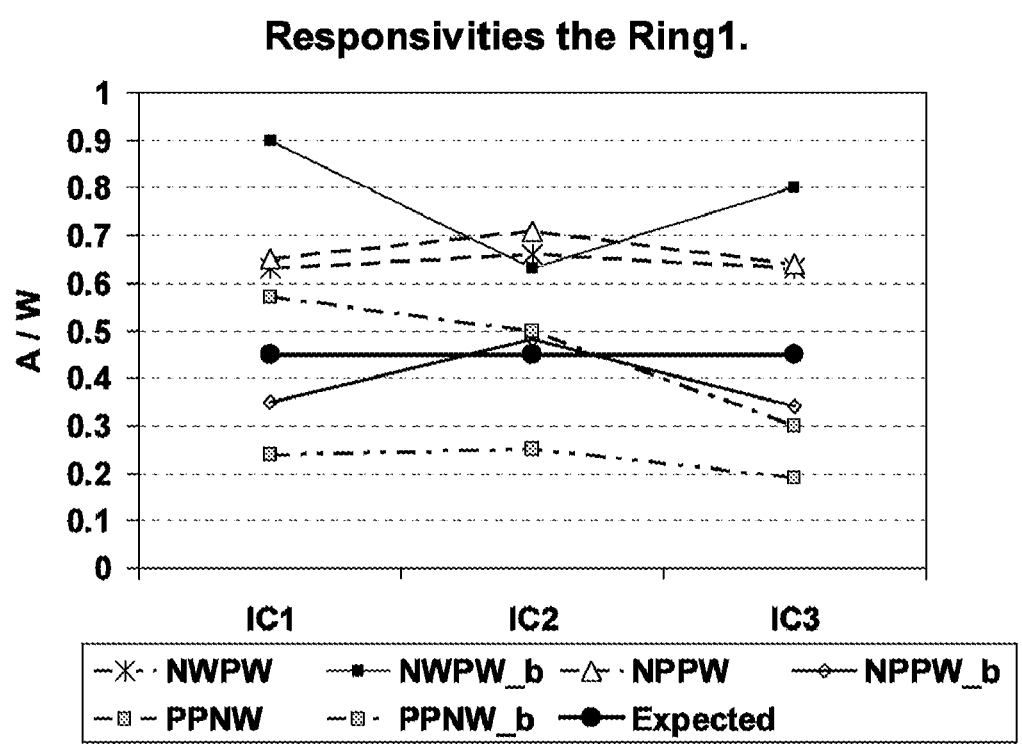
FIG. 8*b* shows Responsivities of the Ring1 Octagons.
Figure 8C:
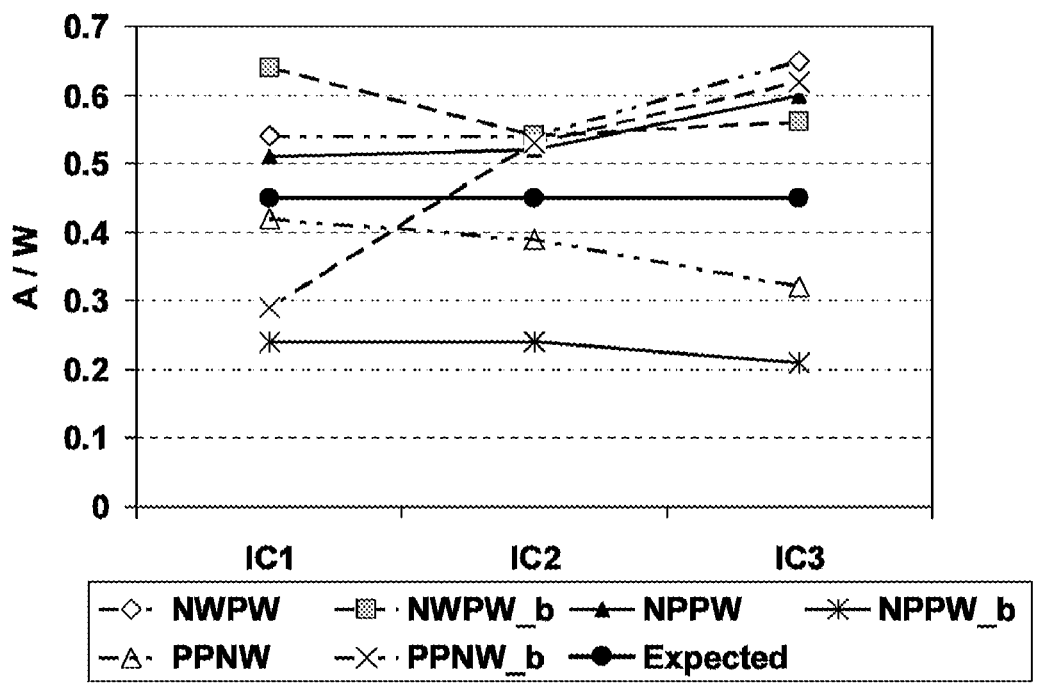
FIG. 8*c* shows Responsivities of the Ring2 Octagons.

The responsivity depends on the wavelength. Responsivity is also known by those skilled in the art as spectral responsivity or radiant sensitivity. R vs. λ characteristics represents the spectral response of a photodiode. The responsivity curves for concentric photodiodes at 660 nm, as shown disclosed according to the inventive principles, in a preferred embodiment, and for a best mode, are shown in FIGS. 8a to 8c.

Figure 9A:
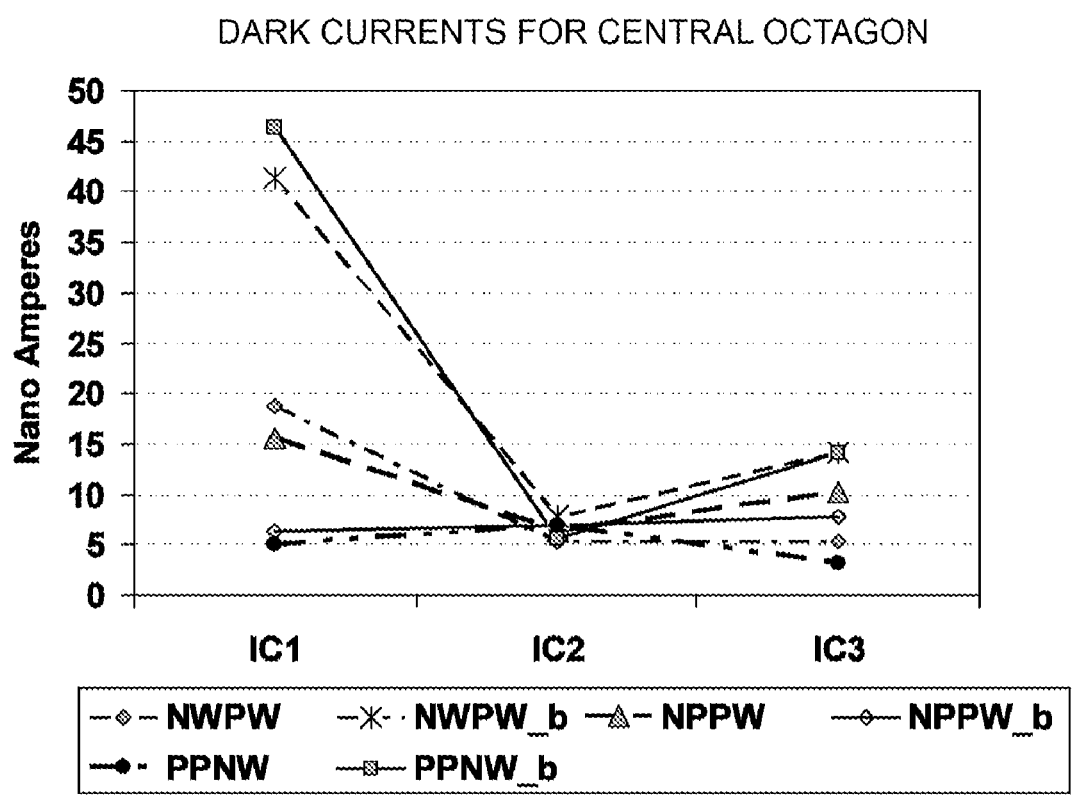
FIG. 9*a* shows Dark Currents for the Central Octagons.
Figure 9B:
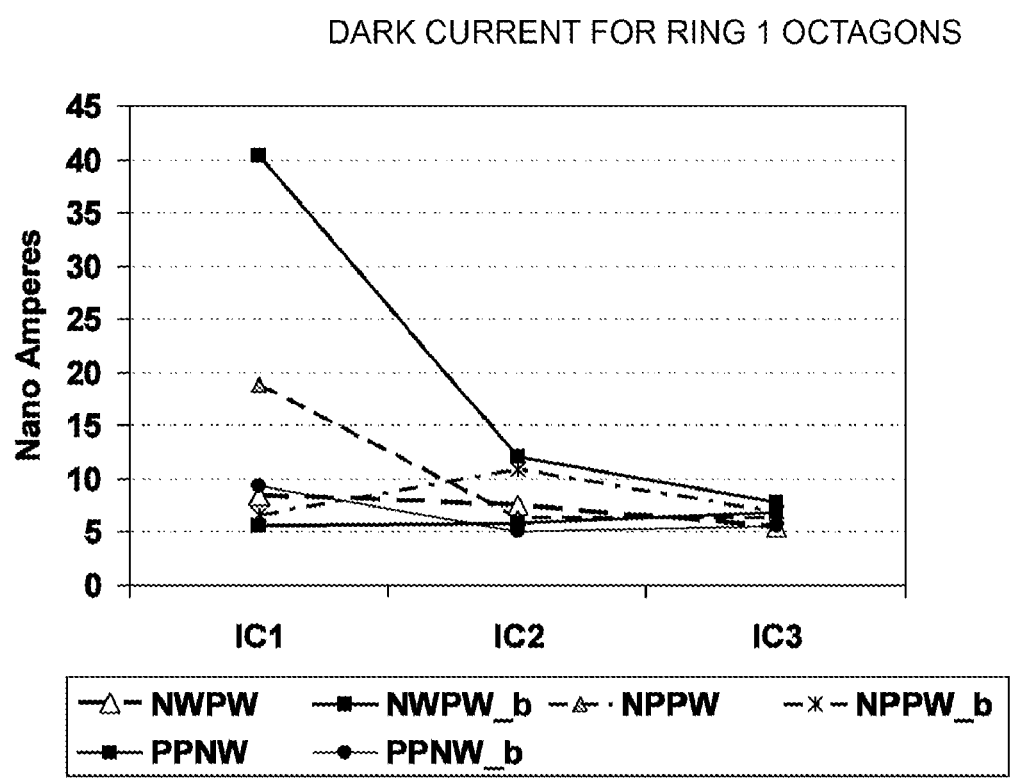
FIG. 9*b* shows Dark Currents for the Ring 1 Octagons.
Figure 9C:
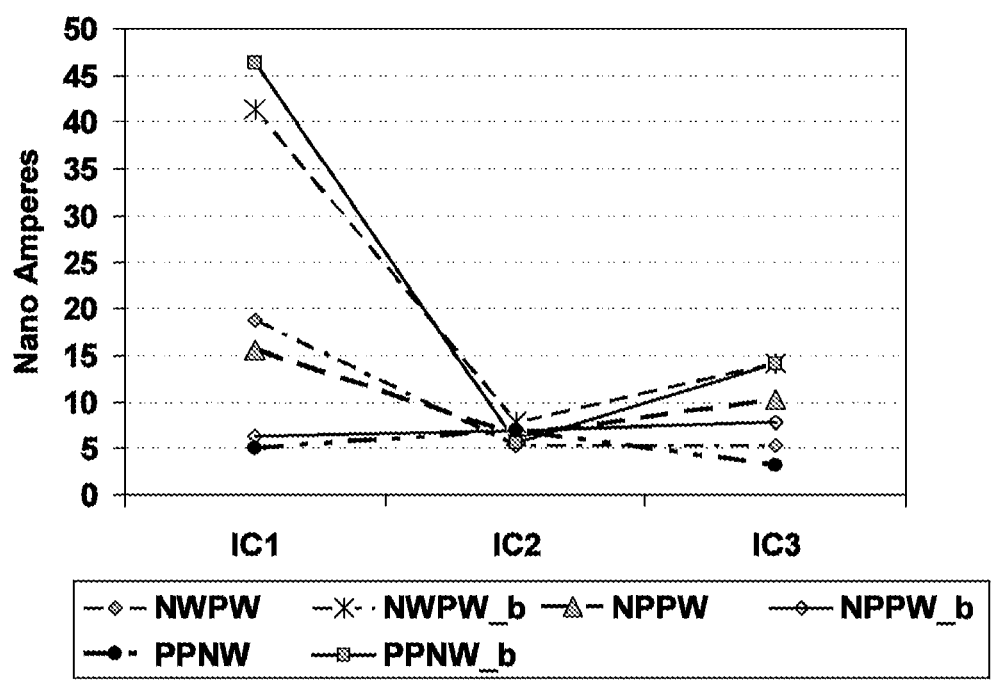
FIG. 9*c* shows Dark Currents for the Ring2 Octagons.

The expected responsivity for a silicon photodiode at 660 nm is around 0.45 A/W. It can be seen from FIG. 9a that the responsivities of central octagonal photodiodes for most NWPW and NPPW structures fall close to the expected value. Similarly, as shown for a preferred embodiment, disclosed in a best mope, the concentric octagonal photodiode Ring 1 and Ring 2 values for the same two structures fall within 10% of the expected silicon responsivity at this wavelength. In a preferred embodiment, as shown for the best mode, FIGS. 9a through 9c depict the leakage current values for photodiode structures at reverse bias voltage of 9V.

Figure 10A:
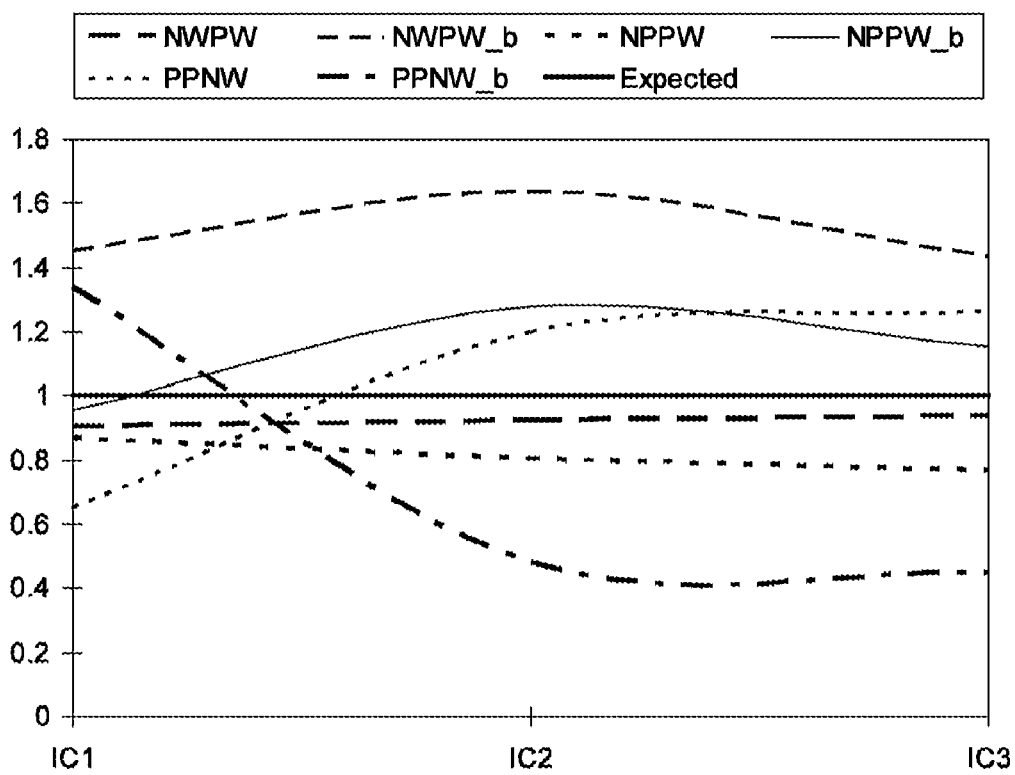
FIG. 10*a* shows Quantum Efficiency of Central Octagons at 660 nm.
Figure 10B:
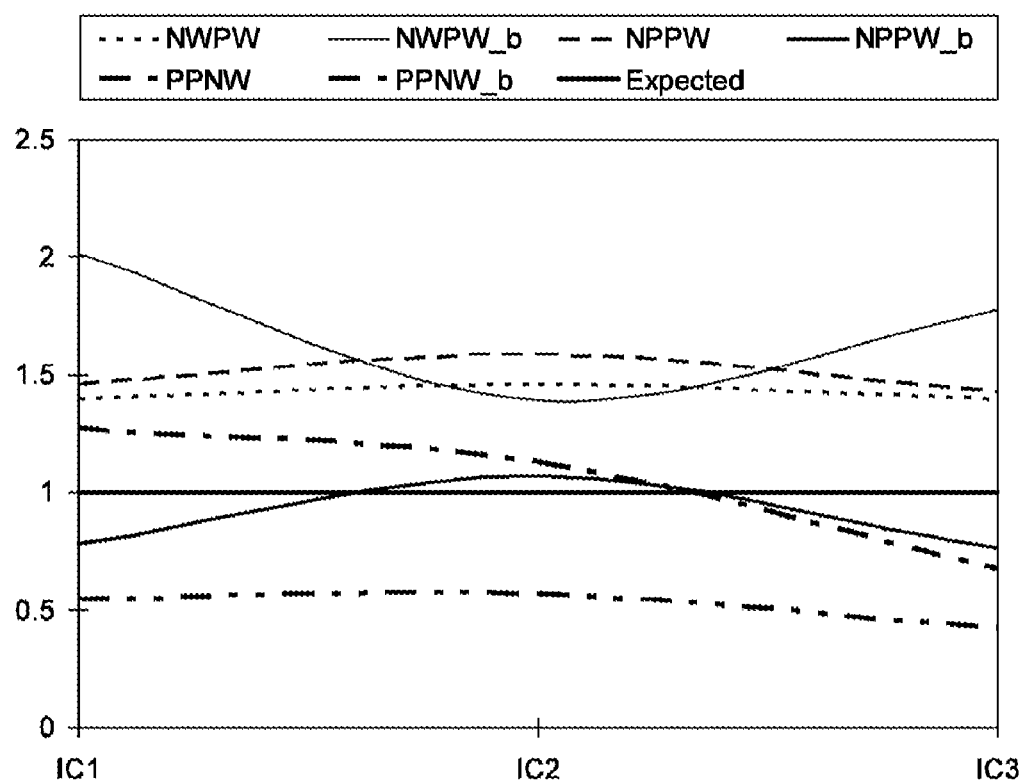
FIG. 10*b* shows: Quantum Efficiency of Ring1 Octagons at 660 nm.

The quantum efficiency is the number of electrons or holes that can be detected as photocurrent divided by the number of the incident photons. The ratio of actual responsivity to ideal responsivity is called quantum efficiency:

$$Q.E = R_{observed}/R_{measured}$$

$$Q.E = Rhe/\lambda q$$

$$Q.E = 1240 R/\lambda$$

Where $h = 6.63 \times 10^{-34}$ j–s, is the Plank's constant, $c = 3 \times 10^8$ m/s, is the speed of light, $q = 1.6 \times 10^{-19}$ C, is electron charge, R is the responsivity in A/W and λ is the wavelength in nm. The FIGS. 10a through 10c show the quantum efficiency values for our photodiode structures at 660 nm.

The invention shown, according to its disclosed inventive principles, and in a preferred embodiment, are photodiode structures in CMOS technology functioning as integrated de-multiplexers for SDM based communications systems. The structures are designed to extract maximum photo current for a given diode area. The structure of these photodiodes include an inductance effect; useful, according to the inventive principles, for high frequency applications.

The fundamental concept of these concentric photo-detectors can be extended to other fabrication technologies and materials to build devices suitable for wavelengths beyond CMOS technologies and beyond the spectral range of silicon.

What is shown and disclosed is,

A concentric semiconductor, comprising, a center semiconductor material; a concentric semiconductor material in contact with the center semiconductor material and arranged in a semiconductor junction; and wherein the center semiconductor material and the concentric semiconductor junction is a P-N junction.

Disclosed is plurality of concentric semiconductors materials arranged with the center semiconductor material, in an array of concentric semiconductor materials in an array of P-N junctions.

Disclosed is wherein the concentric semiconductor materials are in contact with respective inner and outer concentric semiconductors, and are arranged in a plurality of separate P-N junctions.

Disclosed is wherein the separate P-N junctions are P+ Diffusion to N-well junctions, or N+ Diffusion to P-substrate, junctions.

Disclosed is wherein the concentric semiconductor materials are annular.

Disclosed is wherein the P-N junctions are photodiodes.

Disclosed is wherein the concentric semiconductor materials are polygons.

Disclosed is wherein the concentric semiconductor is an inductance.

Disclosed is wherein the P-N junction is a capacitance and the inductance and the capacitance is an inductive capacitive circuit.

Disclosed is a system for detecting spatial domain multiplex signals in a light beam, comprising, a plurality of semiconductor materials arranged in an concentric array with concentric semiconductor materials joined in respective semiconductor junctions; and wherein the respective concentric semiconductor junctions are P-N junctions.

Disclosed is wherein, the array of separate P-N junctions are photodiodes.

Disclosed is wherein the separate P-N junctions include respective terminals connected to an electrical source for applying a bias to the separate P-N junctions.

Disclosed is wherein, the array of separate P-N junctions are annular or circular.

Disclosed is wherein the annular or circular P-N junctions are photo diodes and the photodiodes produce separate currents in response to separate annular or circular, light sources incident on respective annular or circular photodiodes.

Disclosed is wherein the 12, wherein the P-N junctions are P+ Diffusion to N-well junctions, or N+ Diffusion to P-substrate, junctions.

Disclosed is wherein respective concentric semiconductors joined in respective P-N junctions in the array, is an inductance and the P-N junction capacitance and the inductance is an inductive capacitive circuit.

Disclosed is a concentric semiconductor, comprising, a plurality of concentric semiconductor materials joined in an array of respective semiconductor junctions; and wherein the respective semiconductor junctions are respective P-N junctions.

Disclosed is wherein the respective P-N junctions are a capacitance and wherein respective semiconductor materials joined in a the respective P-N junctions is an inductance and the capacitance and the inductance is an inductive capacitive circuit.

Disclosed is a concentric semiconductor of wherein the P-N junctions are photodiodes.

Disclosed is wherein the concentric semiconductor materials are annular or circular.

The invention claimed is:

1. A plurality of concentric photodiodes for the detection of spatially multiplexed annular or circular light beams comprising,
   a plurality of alternate annular or circular semiconductor materials arranged in a concentric array of alternate P semiconductor materials and N semiconductor materials;
   said plurality of P concentric semiconductor materials including a contact with an alternate concentric N semiconductor material in separate photodiode P-N junctions, arranged in said concentric array to produce separate electrical signals in response to separate annular or circular light beams incident on said separate photodiode P-N junctions;
   said separate photodiode P-N junctions including separate terminals adapted for connection to an electrical source adapted for applying a bias to said separate P-N junctions; and
   wherein said N semiconductor material in said photodiode P-N junctions include separate N-wells in said P semiconductor material.

2. The plurality of concentric photodiodes for the detection of spatially multiplexed annular or circular light beams of claim 1, wherein said P semiconductor material includes a P-substrate; said separate N-wells include said separate N-wells in said P-substrate; and wherein said separate N-wells in said P substrate isolate the inter-diode cross influence of said separate photodiode P-N junctions.

3. The plurality of concentric photodiodes for the detection of spatially multiplexed annular or circular light beams of claim 2, including a center P substrate semiconductor material and wherein said alternate concentric semiconductor material in contact with said P-substrate semiconductor materials include N-well to P-substrate junctions or P+ Diffusion to N-well junctions.

4. The plurality of concentric photodiodes for the detection of spatially multiplexed annular or circular light beams of claim 1, wherein said separate N-wells isolate the cross influence of said separate electrical signals in said separate photodiode P-N junctions.

5. The plurality of concentric photodiodes for the detection of spatially multiplexed annular or circular light beams of claim 1, wherein said concentric P and N semiconductor materials include circular or annular circumferences; and wherein said concentric P semiconductor material circular or annular circumference is coextensive with the annular or circular circumference of said alternate N semiconductor material.

6. The plurality of concentric photodiodes for the detection of spatially multiplexed annular or circular light beams of claim 1, wherein said separate N-wells include N+ Diffusion to P-substrate junctions.

7. A plurality of concentric photodiodes for the detection of spatially multiplexed annular or circular light beams, comprising,
   means for producing separate respective signals in response for separate respective annular or circular light projections;
   means to minimize the cross influence of said separate respective signals, produced in response to said separate respective annular or circular light projections.

8. The plurality of concentric photodiodes for the detection of spatially multiplexed annular or circular light beams, of claim 7,
   wherein said means for producing separate respective signals in response for separate respective annular or circular light projections, includes
   means for arranging separate P-N junctions in a concentric array of alternate P semiconductor material and N semiconductor material; and
   said means to minimize the cross influence of said separate respective signals includes means for providing isolation between said separate P-N junctions.

9. The plurality of concentric photodiodes for the detection of spatially multiplexed annular or circular light beams, of claim 8, wherein said means for arranging said P and N semiconductor materials in a concentric array, includes means for arranging the annular or circular circumference of said concentric P semiconductor material coextensively with the annular or circular circumference of said alternate N semiconductor material.

10. The plurality of concentric photodiodes for the detection of spatially multiplexed annular or circular light beams, of claim 8, including means for applying a bias to said separate P-N junctions.

11. The plurality of concentric photodiodes for the detection of spatially multiplexed annular or circular light beams of claim 8, wherein said means for detection of spatially multiplexed annular or circular light beams includes means for detection of said spatially multiplexed annular or circular light beams by P substrate to N-well junctions.

12. The plurality of concentric photodiodes for the detection of spatially multiplexed annular or circular light beams of claim 11, wherein said means to minimize the cross influence of said separate respective signals and said means for providing isolation between said separate P-N junctions, includes said means for detection of said spatially multiplexed annular or circular light beams by said P substrate to N-well junctions.

13. The plurality of concentric photodiodes for the detection of spatially multiplexed annular or circular light beams, of claim 7,
   wherein said means to minimize the cross influence of said separate respective signals includes means for arranging said separate P-N junctions in a concentric array of P substrate semiconductor material and multiple N-wells and means for reverse biasing said separate P-N junctions.

14. A plurality of concentric photodiodes for the detection of spatially multiplexed annular or circular light beams comprising,
   a plurality of alternate annular or circular semiconductor materials arranged in a concentric array of alternate P semiconductor materials and N semiconductor materials;
   said plurality of P concentric semiconductor materials including a contact with an alternate concentric N semiconductor material in separate photodiode P-N junctions; said separate photodiode P-N junctions arranged in said concentric array to produce separate electrical signals in response to separate annular or circular light beams incident on said separate photodiode P-N junctions;

said separate photodiode P-N junctions including separate terminals adapted for connection to an electrical source adapted for applying a bias to said separate P-N junctions; and including separate well junctions in said P semiconductor material or said N semiconductor material; and wherein said separate well junctions isolate the cross influence of said separate electrical signals in said separate photodiode P-N junctions.

15. The plurality of concentric photodiodes for the detection of spatially multiplexed annular or circular light beams of claim 14, wherein said separate well junctions include separate N-wells; and wherein said separate N-wells isolate the inter-diode cross influence of said separate electrical signals in said separate photodiode P-N junctions.

16. The plurality of concentric photodiodes for the detection of spatially multiplexed annular or circular light beams of claim 15, wherein said alternate P semiconductor materials include a P substrate, said separate N-wells include separate N-wells in said P substrate; and wherein said separate N-wells in said P substrate isolate the inter-diode cross influence of said separate photodiode P-N junctions.

* * * * *